United States Patent [19]

Sakamoto et al.

[11] Patent Number: 5,698,062
[45] Date of Patent: Dec. 16, 1997

[54] PLASMA TREATMENT APPARATUS AND METHOD

[75] Inventors: Takao Sakamoto, Yamanashi-ken; Kazuhiro Tahara, Nirasaki; Kenji Momose, Yamanashi-ken; Kosuke Imafuku, Kofu; Shosuke Endo, Kofu; Yukio Naito, Kofu; Kazuya Nagaseki, Yamanashi-ken; Keizo Hirose, Kofu, all of Japan

[73] Assignee: Tokyo Electron Limited, Tokyo, Japan

[21] Appl. No.: 533,383

[22] Filed: Sep. 25, 1995

Related U.S. Application Data

[63] Continuation of Ser. No. 335,970, Nov. 4, 1994, abandoned.

[30] Foreign Application Priority Data

| Nov. 5, 1993 | [JP] | Japan | 5-301270 |
| Nov. 5, 1993 | [JP] | Japan | 5-301271 |
| Nov. 17, 1993 | [JP] | Japan | 5-312683 |
| Nov. 17, 1993 | [JP] | Japan | 5-312684 |
| Apr. 28, 1994 | [JP] | Japan | 6-113587 |

[51] Int. Cl.⁶ .............. C23F 1/02; C23C 14/34; C23C 16/00
[52] U.S. Cl. .............. 156/345; 118/723 E; 204/298.31; 204/298.32; 204/298.34; 204/298.33
[58] Field of Search .............. 156/345; 204/298.31, 204/298.32, 298.33, 298.34, 298.38, 298.39, 298.08, 192.32; 118/723 E

[56] References Cited

U.S. PATENT DOCUMENTS

| 4,263,088 | 4/1981 | Gorin | 156/626.1 |
| 4,464,223 | 8/1984 | Gorin | 204/298.34 |
| 4,579,618 | 4/1986 | Celestino et al. | 204/298.34 |
| 4,617,079 | 10/1986 | Tracy et al. | 156/345 |
| 4,626,312 | 12/1986 | Tracy | 204/298.34 |
| 4,808,258 | 2/1989 | Otsubo et al. | 156/345 |
| 4,863,549 | 9/1989 | Grunwald | 204/298.34 |
| 4,954,212 | 9/1990 | Gabriel et al. | 156/345 |
| 5,057,185 | 10/1991 | Thomas, III et al. | 204/298.34 |
| 5,116,482 | 5/1992 | Setoyama et al. | 204/298.34 |
| 5,147,493 | 9/1992 | Nishimura et al. | 156/345 |
| 5,228,939 | 7/1993 | Chu | 204/298.34 |
| 5,272,417 | 12/1993 | Ohmi | 156/345 |
| 5,314,603 | 5/1994 | Sugiyama et al. | 204/298.32 |
| 5,342,471 | 8/1994 | Fukasawa et al. | 156/345 |

FOREIGN PATENT DOCUMENTS

| 56-33839 | 4/1981 | Japan . |
| 57-131374 | 8/1982 | Japan . |
| 60-245213 | 12/1985 | Japan | 156/345 R |

Primary Examiner—R. Bruce Breneman
Assistant Examiner—Rodney G. McDonald
Attorney, Agent, or Firm—Oblon, Spivak, McClelland, Maier & Neustadt, P.C.

[57] ABSTRACT

A plasma treatment apparatus comprising a chamber earthed, a vacuum pump for exhausting the chamber, a suscepter on which a wafer is mounted, a shower electrode arranged in the chamber, opposing to the suscepter, a unit for supplying plasma generating gas to the wafer on the suscepter through the shower electrode, a first radio frequency power source for adding radio frequency voltage, which has a first frequency $f_1$, to both of the suscepter and the shower electrode, a second radio frequency power source for adding radio frequency voltage, which has a second frequency $f_2$ higher than the first frequency $f_1$, at least to one of the suscepter and the shower electrode, a transformer whose primary side is connected to the first radio frequency power source and whose secondary side to first and second electrodes, and a low pass filter arranged in a circuit on the secondary side of the transformer, and serving to allow radio frequency voltage, which has the first frequency $f_1$, to pass through it but to cut off radio frequency voltage, which has the second frequency $f_2$, while plasma is being generated.

3 Claims, 12 Drawing Sheets

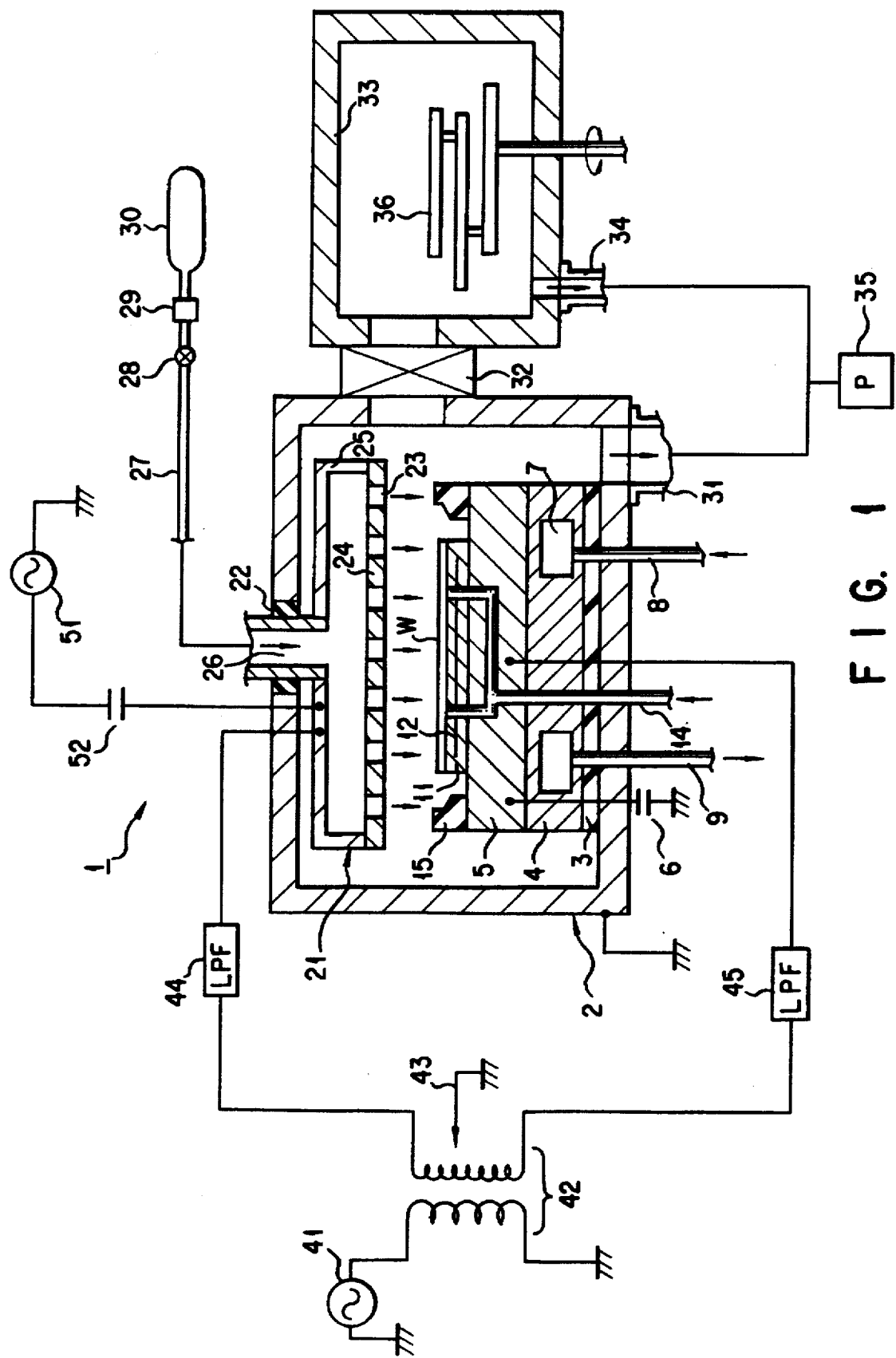
F I G. 1

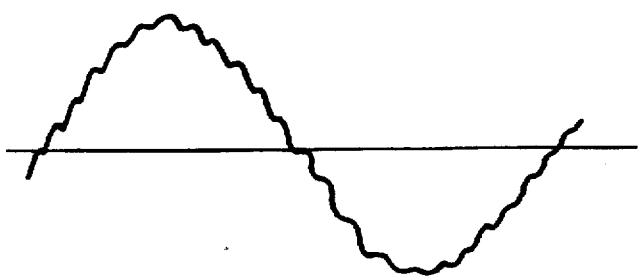
F I G. 6A
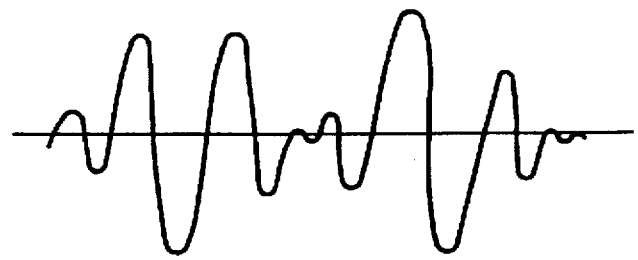
F I G. 6B
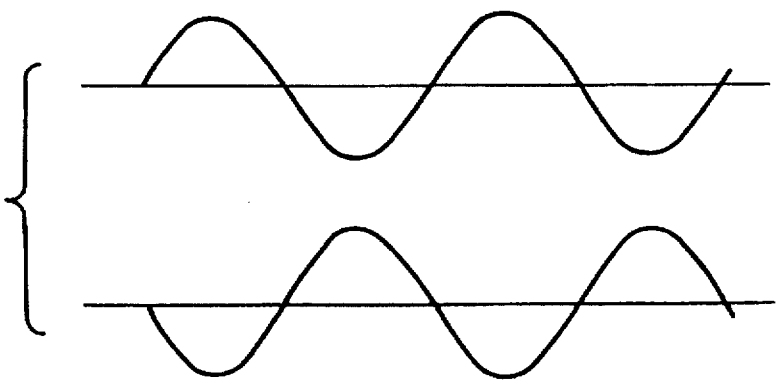
F I G. 7

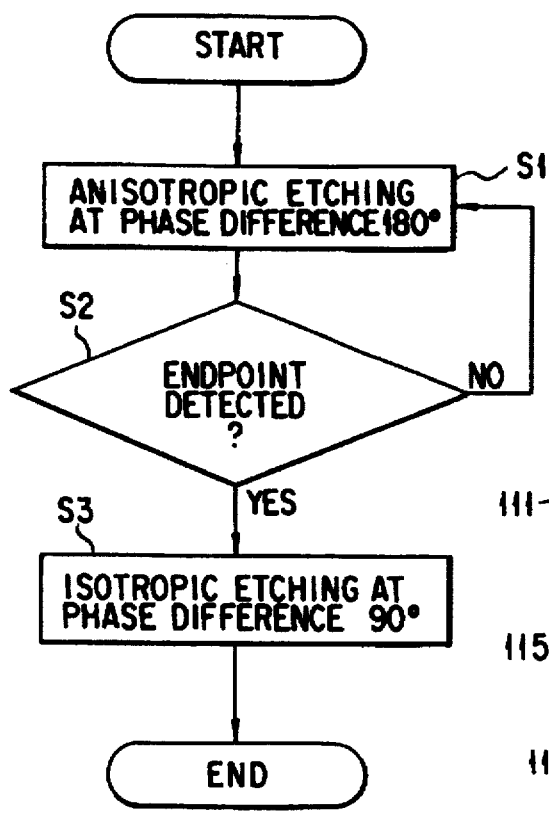
F I G. 13
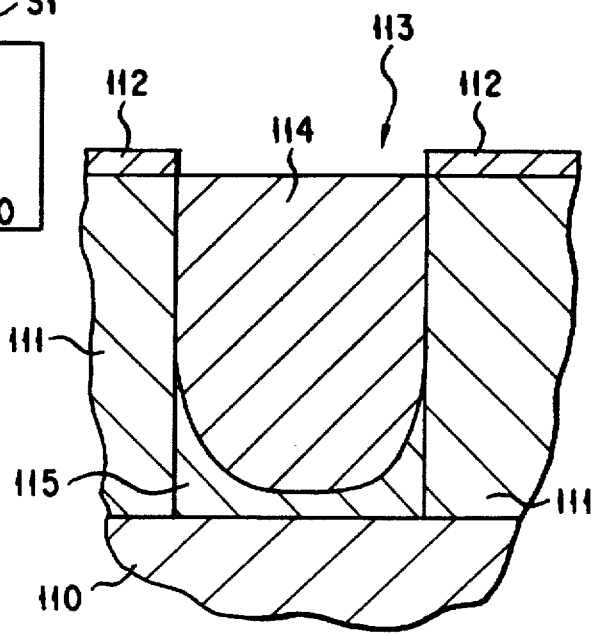
F I G. 14

PLASMA TREATMENT APPARATUS AND METHOD

This application is a Continuation of application Ser. No. 08/335,970, filed on Nov. 4, 1994, now abandoned.

BACKGROUND OF THE INVENTION

1. Field of the Invention

The present invention relates to a plasma treatment apparatus and method for etching or sputtering semiconductor wafers and the like under a plasma atmosphere.

2. Description of the Related Art

The extent to which semiconductor devices have been integrated is quite high these days and it is becoming higher and higher. This requires a finer plasma process in the semiconductor devices manufacturing line. In order to realize this finer plasma process, a more highly selective process must be conducted at a lower pressure and a higher plasma density in the process chamber. One of these plasma process apparatuses which can realize this is of the power split type. In the case of this power split plasma process apparatus, the radio frequency power source is physically separated from the process chamber or tube and it is applied to the electrode via a transformer.

In the conventional plasma process apparatus, however, radio frequency voltage becomes higher as power is increased and ion energy becomes stronger than needed. This makes semiconductor wafers more susceptible to damage. In the conventional plasma apparatus of the power split type, too, pressure in the process chamber is about 250 mTorr and when it is made smaller (or vacuum in the chamber is made higher), plasma becomes unstable and its density cannot be made high.

In the conventional plasma treatment apparatus of the parallel-plate type shown in FIG. 8, radio frequency power is applied only to an upper electrode 103. Therefore, plasma potential caused between both electrodes 102 and 103 cannot be controlled and the density of plasma caused is thus fixed to a certain value. This makes it impossible to realize a super-micro or half-micron process which is now needed.

When a radio frequency oscillator is used for each of upper and lower electrodes, two radio frequency powers cannot be synchronized and the reproducibility of plasma caused in the process or treatment chamber is thus made bad. In addition, it is difficult to control plasma because radio frequency voltages generated by the two radio frequency oscillators interfere with each other and their waveforms are thus distorted. Further, a filter is needed for each circuit to avoid this interference and distortion. This makes the apparatus large in size and complicated in structure.

When a hole 113 having a high aspect ratio is to be formed in a silicon oxide film 116, reaction by reactive ions ($CFx^+$, for example) is effectively caused and reaction product ($SiF_4$, for example) made can be thus quickly exhausted, as shown in FIG. 15A. Etching rate, therefore, is not lowered in the beginning of an etching process. In the end of the etching process, however, it is lowered because reaction product 118 is caught in the hole 113 and not easily exhausted out of it making it difficult for reactive ions to reach the surface to be treated.

SUMMARY OF THE INVENTION

An object of the present invention is therefore to provide a plasma treatment apparatus of the power-split type capable of carrying out plasma treatment under a higher vacuum atmosphere and at a higher density of plasma in the treatment chamber and also capable of controlling ion energy.

Another object of the present invention is to provide a plasma treatment apparatus simpler in structure but capable of generating more stable and uniform plasma.

A further object of the present invention is to provide a plasma treatment apparatus of the parallel-plate type wherein radio frequency powers applied can be synchronized and plasma having a higher reproducibility can be generated even when radio frequency power is applied to each of the opposed electrodes.

A still further object of the present invention is to provide plasma treatment apparatus and method wherein anisotropic and isotropic etchings can be achieved and they can be carried out having a higher aspect ratio but without lowering their etching rates.

A still further object of the present invention is to provide a plasma treatment apparatus capable of more effectively carrying out the replacement of deposition gases without lowering its etching rate to thereby increase its throughput even when etching having a higher aspect ratio is to be carried out.

According to the present invention, there can be provided a plasma treatment apparatus for plasma-treating an object in a vacuum atmosphere comprising an electrically grounded chamber; means for exhausting the chamber; a first electrode on which the object to be treated is mounted; a second electrode arranged in the chamber, opposing to the first electrode; gas supply means for supplying plasma generating gas to the object on the first electrode through the second electrode; a first radio frequency power source for adding radio frequency voltage having a first frequency $f_1$ to both of the first and second electrodes; a second radio frequency power source for adding radio frequency voltage, which has a second frequency $f_2$ higher than the first frequency $f_1$, at least to one of the first and second electrodes; a transformer whose primary side is connected to the first radio frequency power source and whose secondary side to the first and second electrodes; and a low pass filter arranged in a circuit on the secondary side of the transformer and serving to allow radio frequency power having the first frequency $f_1$ but not the second frequency $f_2$ to pass through the low pass filter while plasma is being generated.

According to the present invention, there can be provided a plasma treatment method of plasma-treating an object in decompressed atmosphere comprising adding first and second radio frequency output signals, which have a high tendency of anisotropic etching and a phase difference, to upper and lower electrodes at the beginning of etching process; observing any change in the amount of reaction products in a process chamber; adding first and second radio frequency outputs, which have a high tendency of isotropic etching and a phase difference, to the upper and lower electrodes when the change in the amount of reaction products becomes equal to a predetermined threshold value; and stopping the supply of first and second radio frequency output signals to first and second electrodes, responsive to a change in the amount of reaction products in the chamber, in the middle and end of etching process.

Frequency $f_1$ mentioned above represents those frequencies which active species such as ions and radicals in plasma can follow, that is, those smaller than 2 MHz. Frequency $f_2$ also mentioned above denotes those frequencies which active species cannot follow, that is, those larger than 3 MHz and they are preferably 13.56 MHz, 27.12 MHz and 40.68 MHz.

To add more, frequency $f_1$ denotes those which active products such as ions and radicals in plasma can follow, that is, those smaller than several hundreds kHz, for example, and frequency $f_2$ those which active species cannot follow, that is, those larger than several MHz, for example.

When a radio frequency of 13.56 MHz, for example, which ions can follow is added to the second electrode (or upper one), stable plasma can not be generated at a high density between the opposed electrodes.

Radio frequency of 380 kHz is also added to the upper and lower electrodes. It is therefore possible to control active species such as ions and radicals in plasma and draw them to each electrode. A highly selective plasma etching can be thus realized.

Even when the power of the radio frequency power source which is intended to add radio frequency of 13.56 MHz to realize a high plasma density is increased, ions cannot follow it. Therefore, the matter to be treated can be prevented from being damaged. On the other hand, a highly selective plasma process can be realized when ion energy is controlled by radio frequency of 380 kHz which ions can follow.

A shield unit for shielding radio frequency of 13.56 MHz, for example, is attached to each 380 kHz adding line between the transformer and the first and second electrodes. The radio frequency of 13.56 MHz is not caused, therefore, to enter into the radio frequency power source, which is intended to add 380 kHz, through the electrodes and to interfere with the radio frequency of 380 kHz and influence it.

It is desirable that two radio frequency powers having high and low frequencies are added from radio frequency power sources of the power-split type to first and second electrodes. Plasma of high density can be thus generated between the first and the second electrode by radio frequency power having a radio frequency of several MHz (or radio frequency power of 3 MHz). At the same time, a highly selective plasma process can be realized, without damaging the matter to be treated, when ions in plasma are controlled by a radio frequency of 380 kHz.

Two radio frequencies, low and high in frequency, are added to the first and second electrodes. At the same time when plasma is generated in a narrow area, therefore, active species such as ions and radicals in the narrow area can be accelerated with a higher efficiency.

Further, two radio frequencies, high and low in frequency, are added through different transformers, so that they cannot interfere with each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing the plasma treatment apparatus according to a first embodiment of the present invention;

FIG. 6A shows a signal waveform composed by adding two voltage signals, and FIG. 6B a signal waveform composed by multiplying two voltage signals;

FIG. 7 shows two voltage signal waveforms having a phase difference;

FIG. 13 is a flow chart showing how our plasma treatment apparatus operates to etch a wafer;

FIG. 14 is a sectional view showing a part of the wafer enlarged to explain the etching process or treatment;

DETAILED DESCRIPTION OF THE PREFERRED EMBODIMENTS

Figure 2:
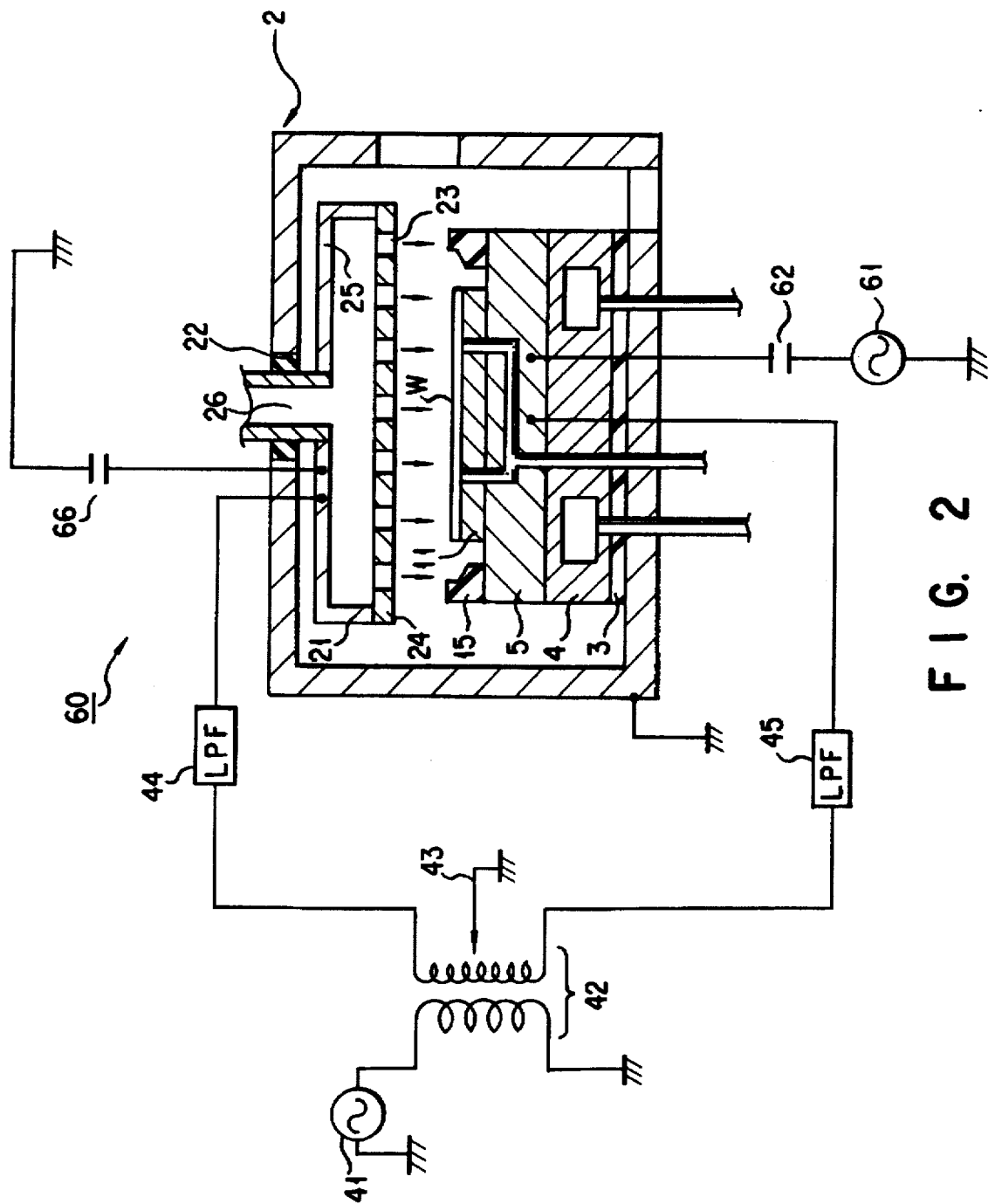
FIG. 2 is a block diagram showing the plasma treatment apparatus according to a second embodiment of the present invention.

Various embodiments of the present invention will be described with reference to the accompanying drawings. The present invention is applied, in this case, to the etching apparatus of the parallel-plate type.

As shown in FIG. 1, an upper (or shower) electrode 21 is opposed to a lower electrode (or suscepter) 5 in a chamber 2 of an etching apparatus 1 according to the first embodiment of the present invention. The chamber 2 is a cylindrical aluminium can whose surface has been covered with almite. This chamber 2 is electrically grounded. The suscepter 5 is supported by a support 4. The support 4 and the suscepter 5 are insulated from the chamber 2 by a ceramic-made insulator plate 3. The suscepter 5 is electrically grounded via a blocking capacitor 6.

A cooling jacket 7 is formed in the suscepter support 4 and a coolant supply source (not shown) is connected to the 7 through supply and exhaust pipes 8 and 9. Coolant such as nitrogen liquid is contained in the coolant supply source and it is circulated between the coolant supply source and the cooling jacket 7 by a pump (not shown). A gas passage 14 is opened into a clearance between an electrostatic chuck 11 and a wafer W and heat exchange gas such as Helium gas is introduced into the clearance through the gas passage 14.

The top of the suscepter 5 is slightly concaved at the center portion thereof. The electrostatic chuck 11 is mounted on the top of the suscepter 5. It has a conductive layer 12 interposed between two sheets of macro-molecular polyimide film, and high DC voltage of 1.5 kV, for example, is applied from a high DC voltage power source (not shown) to the conductive layer 12.

A focus ring 15 is mounted on the top of the suscepter 5 along the outer rim thereof, enclosing the wafer W on the electrostatic chuck 11. The focus ring 15 is made of insulating material which draws no reactive ions and it serves to effectively direct reactive species such as reactive ions and radicals, which are caused by plasma, into the wafer W.

The underside of the upper electrode 21 is separated from the top of the suscepter 5 by about 15–20 mm. The upper electrode 21 is supported by the top of the treatment chamber 2 through an insulating material 22. A plurality of gas holes 23 are formed in the underside of the upper electrode 21 and etching gas is jetted to the wafer W through these gas holes 23. An electrode plate 24 made of SiC or amorphous carbon serves as the underside of the upper electrode 21 while being supported by a member 25, which is made of aluminium whose surface has been covered with almite.

A gas introducing opening 26 is formed in the center of the member 25 and it is communicated with a gas supply source 30 through a pipe 27. A valve 28 and a mass flow controller 29 are attached to the gas supply pipe 27. $CF_4$, $C_4F_8$ or $Cl_2$ gas is stored as etching gas in the gas supply source 30.

A load lock chamber 33 is connected to the process chamber 2 through a gate valve 32. The chamber 2 is provided with an exhaust pipe 31 and the load lock chamber 33 is also provided with an exhaust pipe 34. These exhaust pipes 31 and 34 are connected to a turbo molecular pump 35 so that the chambers 2 and 33 can be decompressed to a range of 10–300 mmTorr. A carrier means 36 having an arm is arranged in the load lock chamber 33 to carry the wafer W from the load lock chamber 33 into the treatment chamber 2 and vice versa.

A radio frequency power applying means which serves to generate plasma in the process chamber 2 will be now described.

The etching apparatus 1 has two radio frequency power sources 41, 51 and a transformer 42. A primary side of the transformer 42 is connected to the first power source 41 and then earthed. A secondary side of the transformer 42 is connected to both of the upper and lower electrodes 21 and 5. A first low pass filter 44 is arranged between the secondary side of the transformer 42 and the upper electrode 21 while a second low pass filter 45 between this secondary side and the lower electrode 5. The first power source 41 serves to apply radio frequency signal, which has a relatively low frequency of 380 kHz, for example, to both of the electrodes 5 and 21. When silicon oxide ($SiO_2$) film is to be etched, it is the most preferable that the frequency $f_0$ of radio frequency signal applied from the first power source 41 is 380 kHz, but in the case of polysilicon (Poly-Si) film, it is preferably in a range of 10 KHz–5 MHz.

The transformer 42 has a controller 43, by which the power of the first power source 41 can be distributed to both of the electrodes 5 and 21 at an optional rate. For example, 400 W of its full power output 1000 W can be applied to the suscepter 5 while remaining 600 W to the upper electrode 21. Radio frequency signals, different in phase by 180 degrees, are also applied to the suscepter 5 and the upper electrode 21.

On the other hand, the second power source 51 serves to apply radio frequency signal, which has a radio frequency of about 13.56 MHz, for example, to the upper electrode 21. It is connected to the upper electrode 21 through a capacitor 52 and then earthed. This plasma generating circuit is called P mode circuit. The invention operates best when the frequency $f_1$ of radio frequency signal applied from the second power source 51 is 13.56 MHz and $f_1$ is preferably in a range of 10–100 MHz.

A case where silicon oxide ($SiO_2$) film on the silicon wafer W is etched by the above-described etching apparatus 1 will be described.

The wafer W is carried from the load lock chamber 33 into the chamber 2 and mounted on the suscepter 5 by the carrier means 36. It is sucked and held by the electrostatic chuck 11. The chamber 2 is decompressed to a predetermined value of vacuum.

The valve 28 is opened and $CF_4$ gas is introduced from the gas supply source 30 into a hollow in the upper electrode 21 through the pipe 27 and the opening 26, while its flow rate being adjusted by the mass flow controller 29. It is further equally blown to the wafer W through the gas holes 23.

After an internal pressure of the chamber 2 becomes 10 mTorr, radio frequency signal of 13.56 MHz is applied from the second power source 51 to the upper electrode 21 to make $CF_4$ gas into plasma and dissociate gas molecules between the upper electrode 21 and the suscepter 5. On the other hand, radio frequency signal of 380 kHz is applied from the first power source 41 to the upper and lower electrodes 21 and 5. Ions and radicals such as fluorine radicals in gas molecules which have been made into plasma are thus drawn to the suscepter 5. Silicon oxide film on the wafer W can be thus etched.

Radio frequency signal applied from the second power source 51 and having a higher frequency is used in this case to generate and maintain the plasma. More stable plasma can be thus generated at a higher density. In addition, active species in plasma are controlled by radio frequency power of 380 kHz, which is different from the frequency applied by the first power supply 41 and which is applied to the upper and lower electrodes 21 and 5. A more highly selective etching can be thus applied to the wafer W. Further, no ions follow radio frequency signal when it has a frequency of 13.56 MHz even when the output of the power source 51 is made large to obtain plasma of higher density. Therefore, the wafer W is not damaged.

First and second low pass filters 44 and 45 are attached to the secondary side circuit of the transformer 42. This prevents radio frequency signal of 13.56 MHz from entering from the second power source 51 into the secondary side circuit of the transformer 42. Radio frequency signal of 13.56 MHz, therefore, does not interfere with radio frequency power of 380 kHz and plasma can be thus made stable. Blocking capacitors may be used instead of low pass filters 44 and 45. Although radio frequency power has been continuously applied to the electrodes in the above case, modulation mode power including various strong and weak powers may be applied to them.

A second apparatus 60 will be described referring to FIG. 2.

In the plasma treatment apparatus 60 according to the second embodiment of the present invention, a second radio frequency power source 61 is connected to the lower electrode (or suscepter) 5. In short, a terminal of the second power source 61 is connected to the lower electrode 5 through a capacitor 62 while another terminal thereof is electrically grounded. The upper electrode 21 is electrically grounded through a capacitor 66. This plasma generating circuit is called RIE mode circuit.

Figure 3:
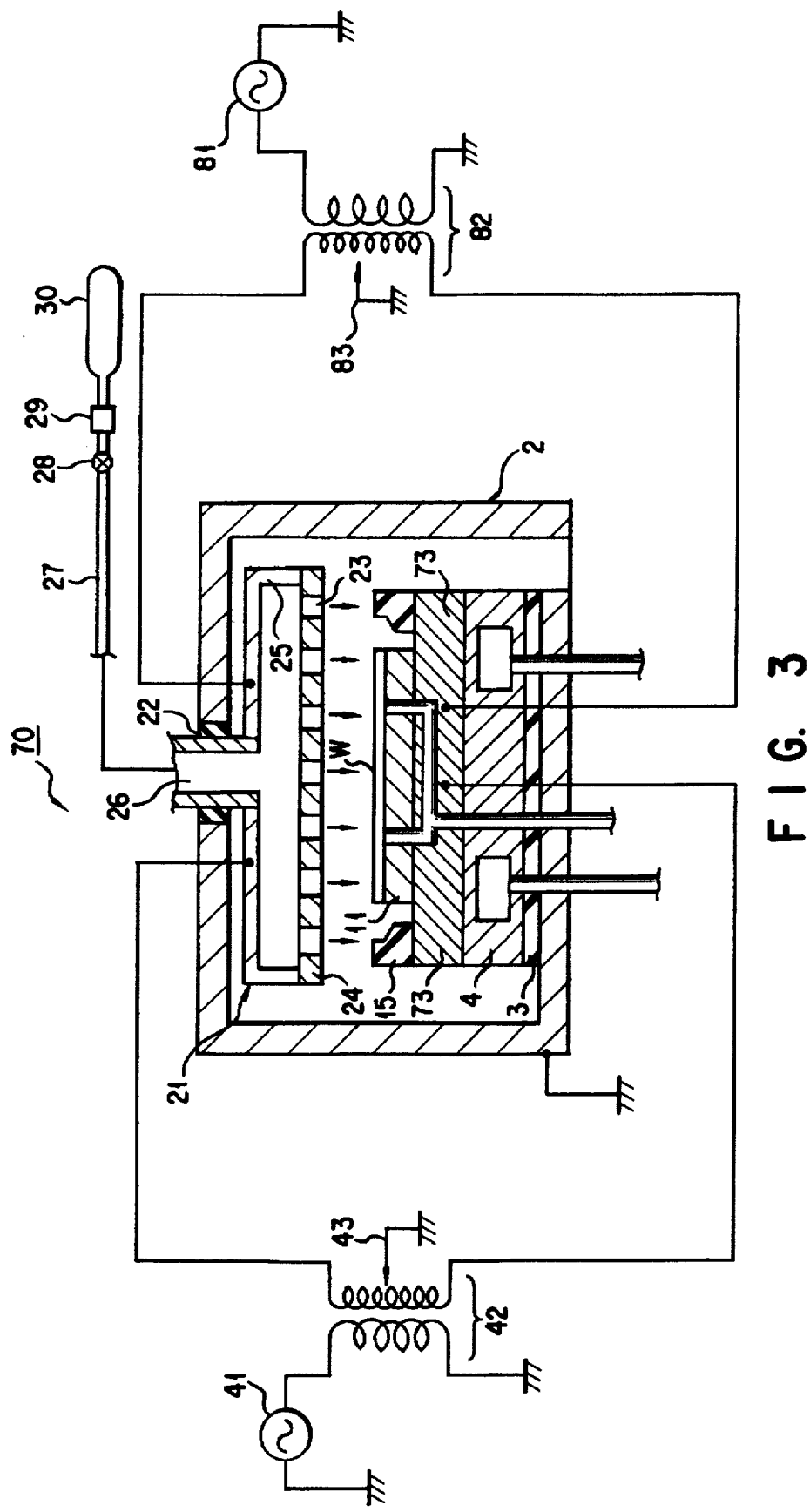
FIG. 3 is a block diagram showing the plasma treatment apparatus according to a third embodiment of the present invention.

An apparatus 70 of a third embodiment will be described referring to FIG. 3. Same components of the apparatus 70 as those of the above-described ones will be described only when needed.

A radio frequency power circuit of this apparatus 70 is different from that of the above-described first one in that a suscepter 73 is not earthed, that no low pass filter is attached to the secondary side circuit of the transformer 42, and that a second transformer 82 is attached to the circuit of a second power source 81.

The second power source 81 is intended to generate radio frequency signal of 3 MHz. It is connected to the primary side of the transformer 82, whose secondary side is connected to upper and lower electrodes 21 and 73. A controller 83 is also attached to the secondary side of the transformer 82 to control the distribution of power.

When etching is to be applied to the wafer W in apparatus 70, radio frequency signals of 3 MHz, different in phase by 180 degrees, are applied from the radio frequency power source 81 to the suscepter 73 and the upper electrode 21 to generate plasma at an area between the suscepter 73 and the electrode 21. At the same time, radio frequency signals of 380 kHz, different in phase by 180 degrees, are applied from a radio frequency power source 74 to them to accelerate species in the plasma into the wafer W.

When the second power source 81 is adjusted, therefore, plasma density itself can be controlled. The energy of ions and radicals in plasma can also be controlled when the first power source 41 is adjusted. A more highly selective etching can be thus achieved without damaging the wafer W.

Further, two radio frequency power sources 41 and 81, whose frequencies are and low or high relative to the other, are arranged in the power-split manner and independent of each other in apparatus 70. Therefore, no interference between the power sources themselves is caused and a more stable treatment can be thus achieved.

Furthermore, radio frequency power is supplied from two power sources 41 and 81 to the upper and lower electrodes 21 and 73. This enables the flow of power to be focused in the narrow area between the upper electrode 21 and the lower electrode 73. Plasma having a higher density can be thus generated and the efficiency of controlling ions in plasma can also be increased.

Figure 4:
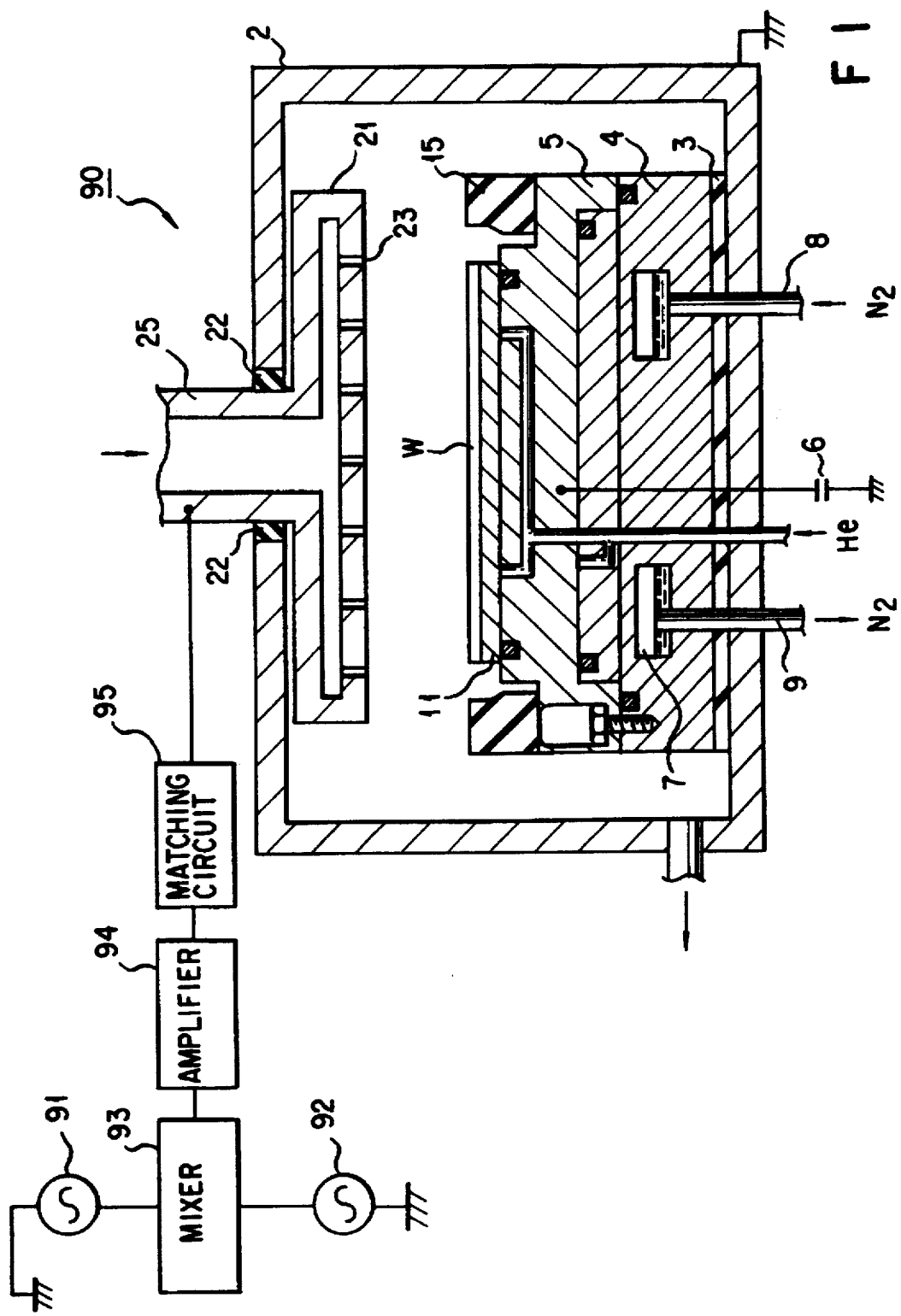
FIG. 4 is a block diagram showing the plasma treatment apparatus according to a fourth embodiment of the present invention.

An apparatus 90 of a fourth embodiment will be described with reference to FIG. 4. Description will be made about same components of the fourth apparatus as those of the above-described ones only when needed.

In the fourth apparatus 90, a circuit is so arranged that power composed (or mixed) by two radio frequency signals can be applied to each upper electrode 21. First and second power sources 91 and 92 are connected in parallel to a mixer 93 to compose two radio frequency signals, different in frequency, in the mixer 93. The mixer 93, an amplifier 94 and a matching circuit 95 are connected in series to the upper electrode 21 to amplify and match the mixed signal. Two power sources 91 and 92 are earthed and the lower electrode 5 is earthed through the capacitor 6. If necessary, the radio frequency voltages may be applied to the lower electrode 5 and the upper electrode 21 may be electrically grounded.

It will be described how the semiconductor wafer W is etched.

First radio frequency signal having a frequency of several tens MHz such as 13.56 MHz is generated in the first power source 91 and second radio frequency voltage having a frequency of several hundreds KHz such as 400 KHz in the second power source 92. These first and second radio frequency signals are composed by the mixer 93 and amplified to a certain value of energy by the amplifier 94. The amplified signal is then matched by the matching circuit 95 and applied to the upper electrode 21.

According to findings of the inventors, the composition ratio of gas plasma generated in the chamber 2 can be changed when two radio frequency signals, different in frequency, are composed as described above and a frequency thus composed is adjusted. In a case where $CF_4$ is used as etching gas, the composition ratio of $CF_3$, $CF_2$, CF, C and F in plasma can be changed when the frequency composed is adjusted. The composition ratio of $CF_3$ and $CF_2$ in plasma can be adjusted to more than 50%, optimum for etching, or preferably to a range of 50–80%. This composition rate enables optimum etching to be achieved.

Power composed by adding two radio frequency signals, different in frequency, to each other, as shown in FIG. 6A, may be applied to the upper electrode 21. Or power composed by multiplying two radio frequency signals, different in frequency, from each other, as shown in FIG. 6B, may be applied to the upper electrode 21. It is desirable that an optimum composing method is obtained from experiments or calculations, considering the processing surroundings or conditions such as etching gas, processing pressure and objects to be treated.

It will be described how the plasma etching apparatus 90 having the above-described arrangement operates as a whole.

The wafer W is carried into the chamber 2, which has been decompressed to $1\times10^{-4}$ Torr from several Torr, and mounted on the suscepter 5. The radio frequency voltage composed is applied to between the upper electrode 21 and the lower electrode 5 to generate plasma there, while process gas is introduced into the treatment chamber through the upper electrode 21. The composition ratio of plasma is adjusted to an optimum, composition by selecting a radio frequency composed responsive to the treating conditions.

The wafer W is most likely over-heated by plasma radiation heat at the treating time. It is therefore cooled by the cooling jacket 7 in the suscepter support 4. The temperature of the wafer W is micro-adjusted by a heater (not shown). When the etching treatment is finished in this manner, remaining gases are exhausted out of the chamber 2 and the wafer W is heated to an appropriate temperature and carried into the adjacent load lock chamber 33. A series of etching treatments are thus finished.

Figure 5:
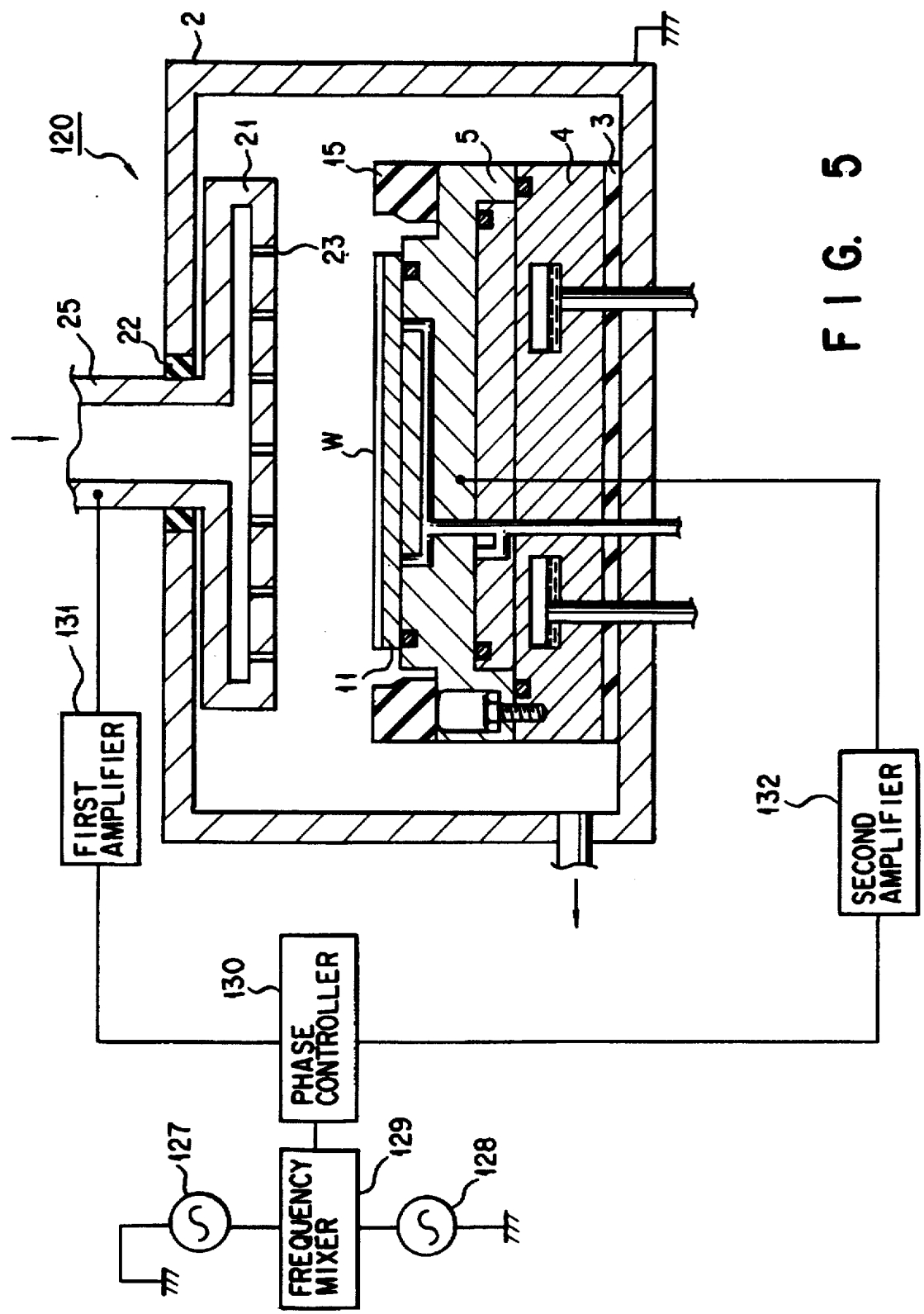
FIG. 5 is a block diagram showing the plasma treatment apparatus according to a fifth embodiment of the present invention.

A plasma etching apparatus 120 of fifth embodiment will be described with reference to FIG. 5. Additional description will not be made about same components of the apparatus 120 as those of the above-described ones except when needed.

In the fifth embodiment, two radio frequency signals that are, different in frequency are composed by a mixer 129 and then distributed again to two radio frequency signals by a phase controller 130. First radio frequency signal is applied thus distributed is applied to the upper electrode 21 through a first amplifier 131 while second radio frequency signals to the lower electrode 5 through a second amplifier 132.

According to the fifth plasma treatment apparatus, the composition ratio of reactive ions in plasma can be changed. Any desirable selection ratio can be thus obtained relative to the kind of wafers and processing accuracy can therefore be enhanced to a remarkable extent even though the apparatus is simpler in arrangement. Further, the composition ratio of plasma generated in the treatment chamber can be adjusted to be optimum and the phase difference between voltages of two radio frequency signals can be controlled. This enables plasma to be made more stable.

Figure 8:
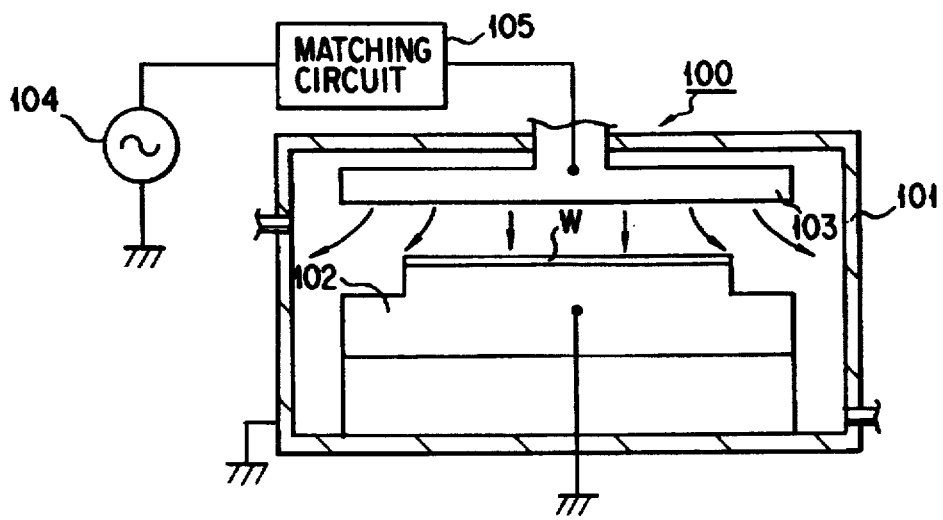
FIG. 8 is a block diagram showing an electric field for generating plasma in the conventional plasma treatment apparatus.
Figure 9:
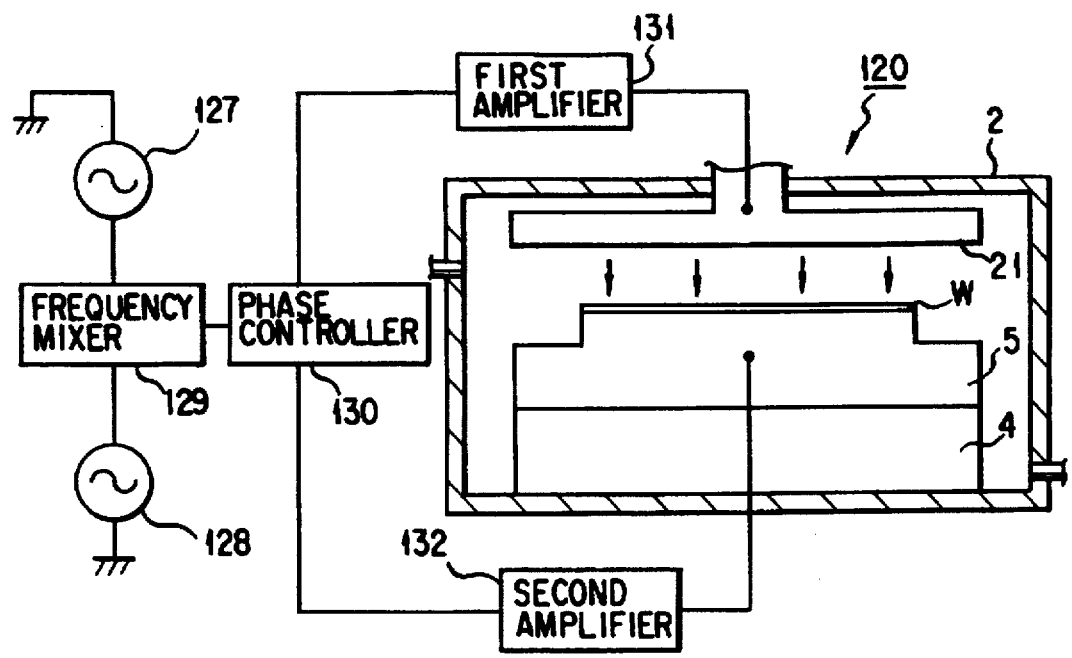
FIG. 9 is a block diagram showing an electric field for generating plasma in the fifth plasma treatment apparatus of the present invention.

The conventional apparatus 100 is of the triode type in which the side wall of a process chamber 101 serves as a third electrode, as shown in FIG. 8. Electric field, therefore, is directed toward the side wall and may etch it from which particles can be generated in the chamber 101. In the case of this apparatus 120, however, electric field can be focused between the upper electrode 21 and the lower electrode 5, as shown in FIG. 9. Therefore, the side wall of the chamber 2 is not etched and particles are not generated in the chamber 2. A more uniform and stable etching treatment can be thus achieved. The phase difference between the first and the second radio frequency signals is controlled to about 180 degrees by the above-described circuit, as shown in FIG. 7. When radio frequency signals whose phases are shifted from each other in this manner are applied to the upper and lower electrodes 21 and 5, respectively, a range in which plasma is kept stable can be enlarged.

According to the apparatus 120, radio frequency signals are once mixed, and then distributed and applied between both of the electrodes 5 and 21. Therefore, even if not filter is used, therefore, the radio frequency signals can be stopped from interfering with each other and no distortion of their waveforms is caused. This enables the apparatus to be made simpler in arrangement and smaller in size.

Figure 10:
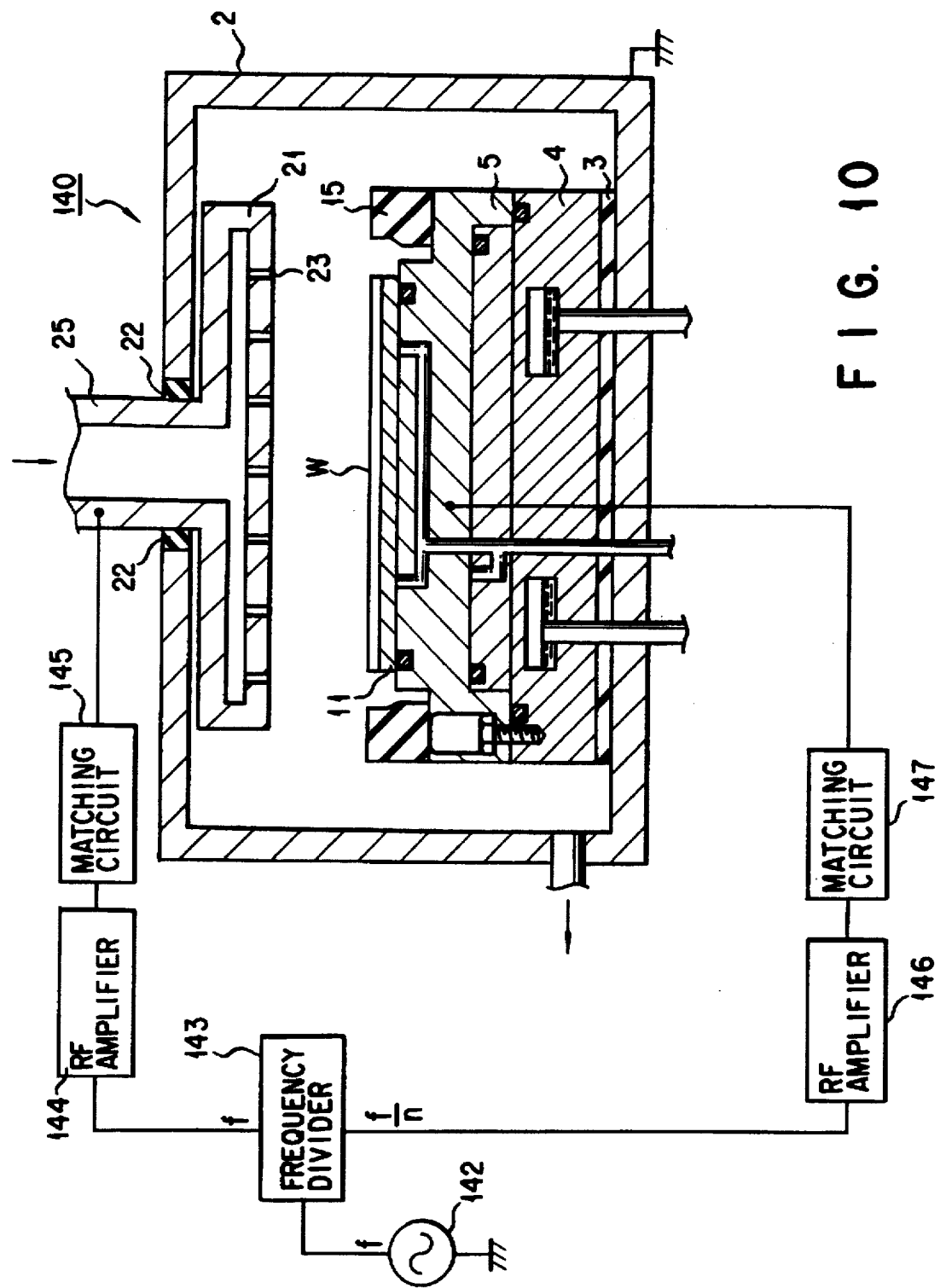
FIG. 10 is a block diagram showing the plasma treatment apparatus according to a sixth embodiment of the present invention.

A plasma etching apparatus 140 of sixth embodiment will be described with reference to FIG. 10.

A first output signal having a first frequency (f) such as 2 MHz is applied from a radio frequency power source 142. A first output signal having a first frequency (f) is frequency-distributed to a second output signal having a second frequency (f/n) such as 380 kHz by a frequency divider 143. Further, the first output signal is amplified to 200 W by a first RF amplifier 144 and then applied to the upper electrode 21 through a first matching circuit 145. On the other hand, a second output signal is amplified to a desired value or 200 W, for example, by a second RF amplifier 146 and then applied to the lower electrode 5 through a second matching circuit 147.

Figure 11:
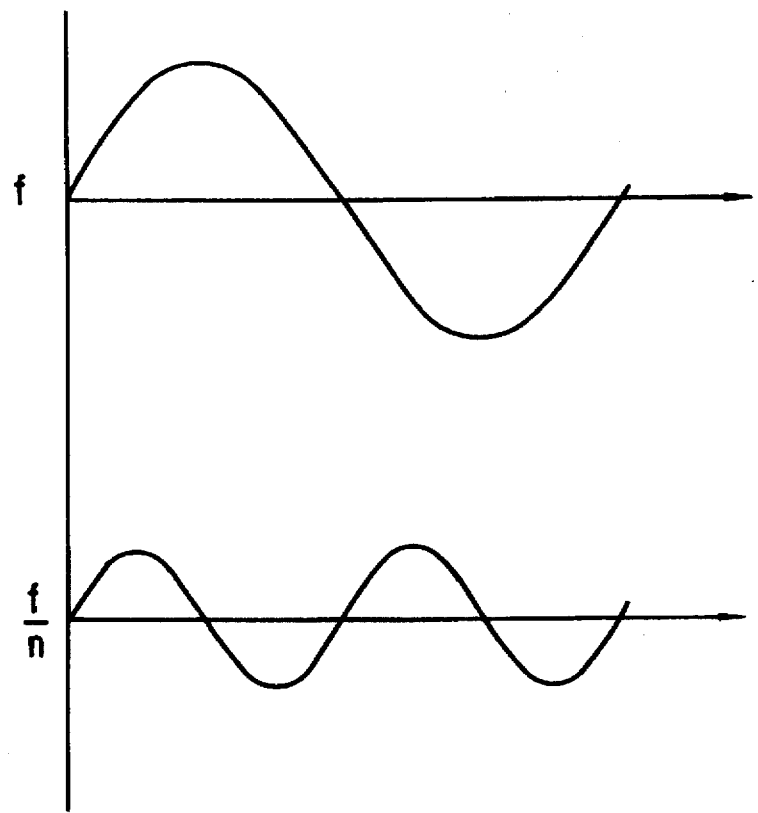
FIG. 11 is a waveform diagram showing signal divided into frequencies f and f/n.

According to this sixth apparatus 140, signal sent from one oscillator 142 is divided and then applied to the upper and lower electrodes 21 and 5. As shown in FIG. 11, therefore, first and second signals applied to the electrodes can be synchronized with each other. Plasma can be thus generated in the treatment chamber with a higher reproducibility. Even if a mass production is intended, therefore, etching process can be achieved with same quality, so that throughput and productivity can be increased.

According to findings of our inventors, damage added to the wafer W can be reduced to a greater extent when the rate (n) is selected in such a way that the first frequency (f) is less than ten times higher than the second frequency (f/n) divided. An etching treatment suitable for super-micro or half micron level processing and needed these days can be thus achieved.

The frequency (f) of the signal outputted from the radio frequency oscillator 142 and the rate (n) at which the frequency (f) is divided by the frequency divider 143 can be obtained from experiments or calculations, which are conducted considering treating conditions such as the kind of process gases used, its flow rate, processing pressure, and the kind of objects to be processed.

According to the above-described arrangement of the present invention, electric field excited by radio frequency power can be focused between the upper 21 and the lower electrode 5. This prevents the side wall of the chamber 2 from being etched to cause particles in the chamber 2.

Figure 12:
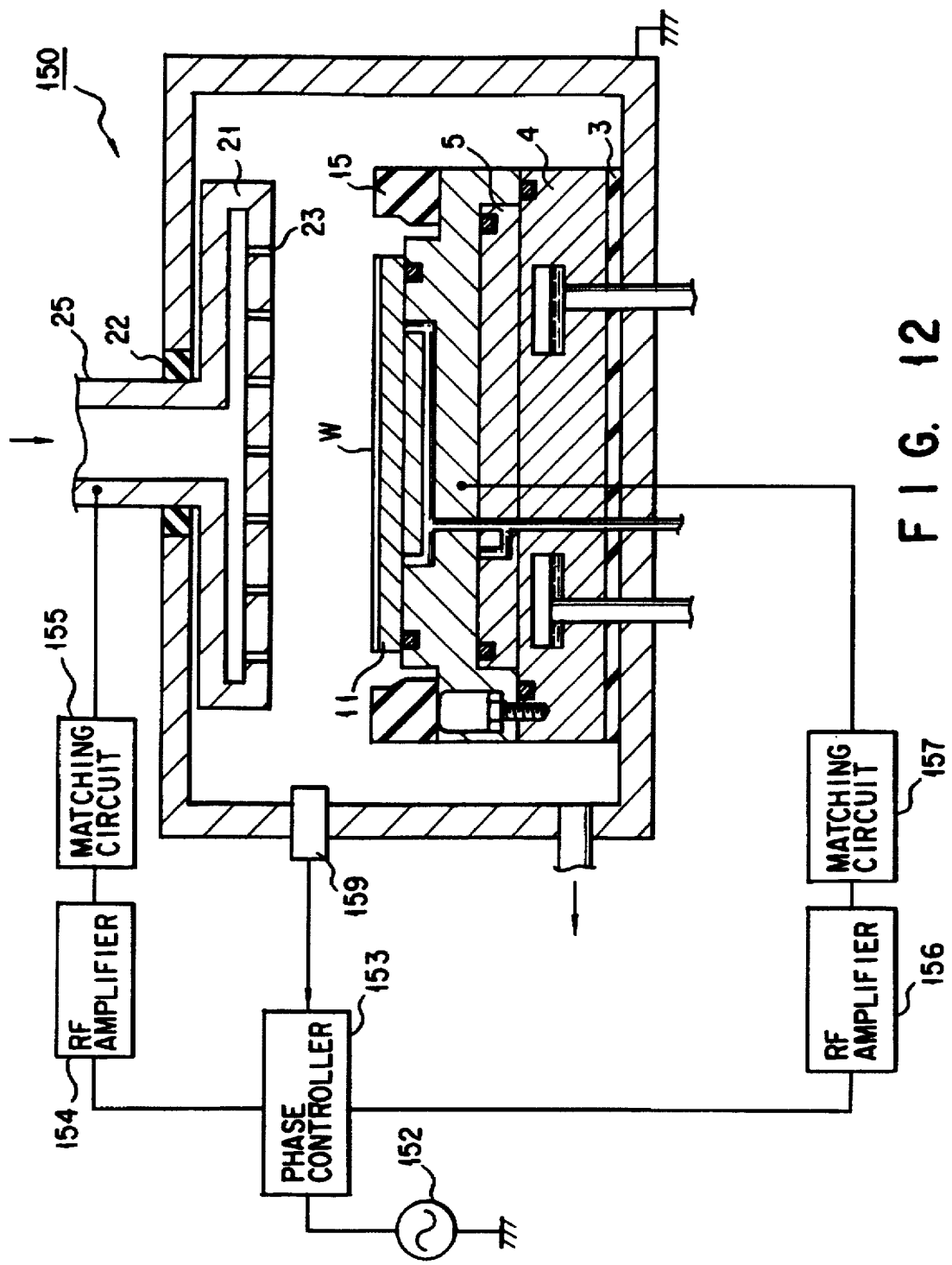
FIG. 12 is a block diagram showing the plasma treatment apparatus according to a seventh embodiment of the present invention.

Referring to FIG. 12, an apparatus of seventh embodiment 150 will be described. Additional description will not be made about same components of this seventh apparatus as those of the above-described embodiments except when needed.

In the seventh apparatus 150, a mass spectrograph 159 is arranged in the side wall of the process chamber 2. The mass spectrograph 159 is intended to measure any change in the amount of reaction products present in the chamber 2. In short, it serves to analyze energy in the chamber 2 through a probe arranged in the chamber and detect ion or energy spectrum of each molecular component.

Although change in the amount of reaction products present in the chamber 2 has been detected by the mass spectrograph in the seventh apparatus 150 of the present invention, a detector may be used to detect emission spectra caused in the process chamber and change in the amount of reaction products present in the chamber 2 in response to change in the emission spectra detected.

A detection signal is sent from the mass spectrograph 159 to a phase controller 153 and outputted from a radio frequency oscillator 152 to feedback-control phases of first and second radio frequency signals applied to the upper and lower electrodes 21 and 5. First and second radio frequency signals whose phases have been controlled by the phase controller 153 are amplified to predetermined values by first and second RF amplifiers 154 and 156 and then applied to the upper and lower electrodes 21 and 5 through first and second matching circuits 155 and 157.

A circuit is housed in each of first and second matching means 155 and 157 to detect the voltage phase of radio frequency power, and outputs of these circuits are fed back to the phase controller 153 to keep phases of first and second radio frequency signals certain.

Referring to FIGS. 13 and 14, it will be described how the wafer W is etched by the seventh apparatus 150.

In FIG. 14, it is preferable at the beginning of etching process that a portion 114 of silicon oxide film is etched at a high etching rate by anisotropic etching. For this purpose, radio frequency signals having a phase difference of 180 degrees and a high tendency of anisotropic etching are applied between the electrodes 5 and 21 at a step S1 in FIG. 13 or at the start of etching process. The etching process is thus advanced at high etching rate.

The etching process advances and when an end point is detected, responsive to change in reaction products, at a step S2 by the detector 159, it is preferable that selection rate is made high to arrange the shape etched. Therefore, phases are shifted, responsive to signal detected, by the phase controller 153 and radio frequency signals having a phase difference of 90 degrees and a high tendency of isotropic etching are applied between the electrodes 5 and 21 at a step S3. Etching in which selection rate is regarded as being important is thus added to a portion 115. After a predetermined time passes or when change in reaction products detected by the detector 159 shows that no more etching is needed, the supply of radio frequency powers is stopped and the etching process is thus stopped.

According to findings of our inventors, the composed waveform of both radio frequencies is large and the ion energy of plasma becomes large accordingly, when radio frequency signals having the phase difference of 180 degrees, for example, are applied between the electrodes. Physical etching or sputtering effect is thus fulfilled relative to the matter to be processed and etching having a high tendency of anisotropic etching can be achieved at a high etching rate.

When radio frequency signals are caused to have the phase difference of 90 degrees, while shifting their phases from each other, and they are applied between the electrodes, the composed waveform of both radio frequencies becomes small and the ion energy of plasma is small accordingly. Physical etching or sputtering effect is thus reduced relative to the matter to be etched and chemical etching mainly progresses on the surface of the matter. Selection ratio is thus made high and a better etched shape can be obtained accordingly with a 90 degree phase.

Even when phases are shifted from each other, only selection ratio becomes high while leaving the density of plasma unchanged. This can keep the throughput unchanged.

According to the above-described arrangement of the present invention, the phase difference of radio frequency signals applied to the opposed electrodes in the treatment chamber can be controlled. This enables both of anisotropic and isotropic etchings to be enhanced in an apparatus and the shape etched to be controlled to the optimum extent. Plasma treatment apparatus and method most suitable for super micro-processing at half or sub-half micron level can be therefore provided as now needed.

Figure 15A:
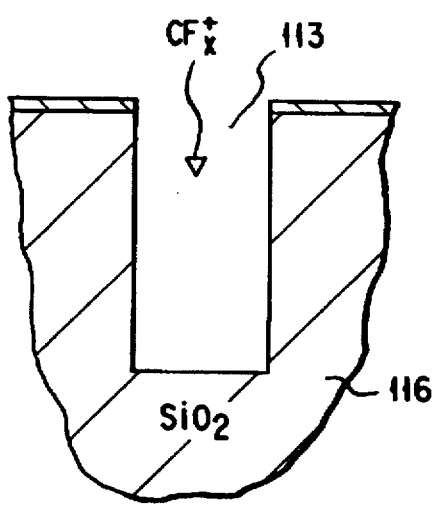
FIGS. 15A and 15B are sectional views each showing a part of the wafer enlarged to explain conventional etching process.
Figure 15B:
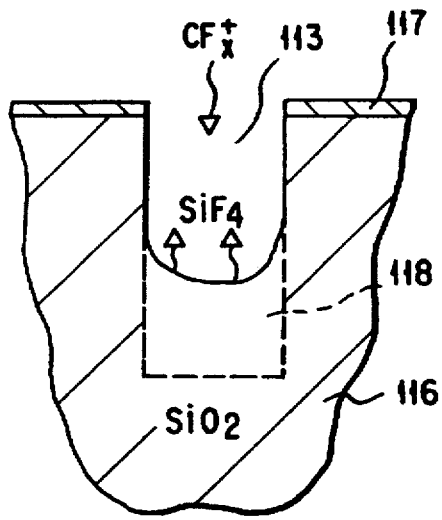
Figure 16:
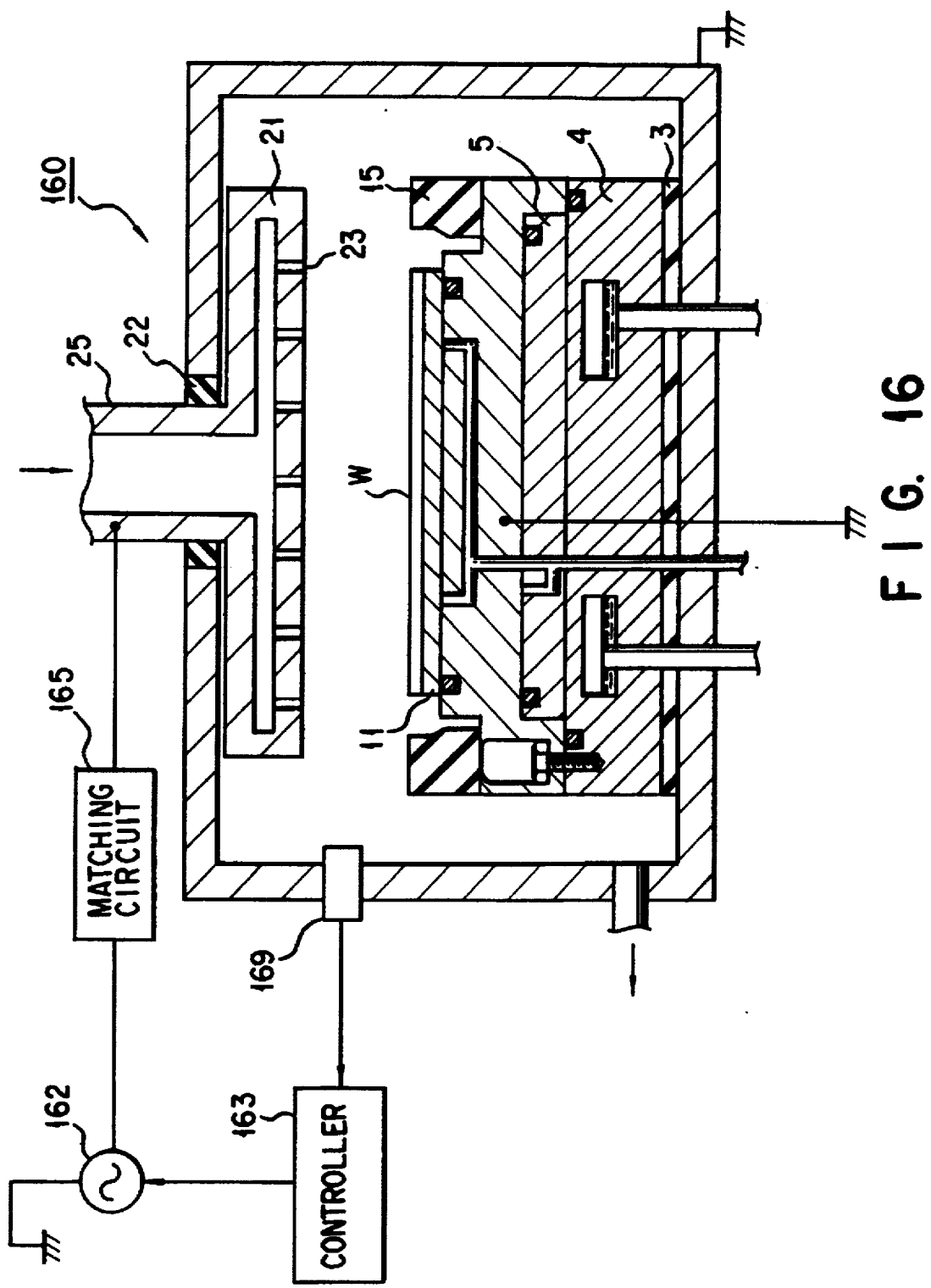
FIG. 16 is a block diagram showing the plasma treatment apparatus according to an eighth embodiment of the present invention.

An eighth apparatus 160 will be described referring to FIGS. 15A, 15B and 16.

There will be described a case where resist 117 is coated on silicon oxide film 116 and contact holes 113 are formed in silicon oxide film 116, using $CF_4$ gas. The hole 113 can be formed, having such a high aspect ratio as shown in FIG. 15A, at the beginning of etching process. This is because reactive ions such as $CFx^+$ can be fully supplied to silicon oxide film 116. In the middle or end of etching process, however, reaction products 118 such as $SiF_4$ caused by etching reaction are caught in the hole 113, as shown in FIG. 15B, and reactive ions ($CFx^+$) cannot reach the face of the matter to be processed. This causes etching rate to become low.

In order to solve this, there has been provided a technique of employing a system for on-off controlling the supply of process gas. According to this technique, reaction products (or deposition gases) caught in the etching holes are replaced by reaction gas, while stopping the supply of process gas, to conduct etching at a high aspect ratio. When the amount of process gas supplied is changed, however, it takes a long time that process surroundings such as pressure in the process chamber become stable. The throughput is thus lowered.

In the eighth apparatus 160, therefore, a mass spectrograph 169 is arranged in the side wall of the chamber 2 to measure any change in the amount of reaction products present in the chamber 2. The mass spectrograph 169 serves to analyze energy in the process chamber through a probe (not shown) and detect the ion or energy spectrum of each molecular component.

An emission spectrum detector may be used instead of the mass spectrograph 169. Emission spectra caused in the process chamber are detected in this case by the emission spectrum detector and, responsive to the change of each spectrum thus detected, the change in the amount of reaction products present in the chamber 2 can be detected.

Signal representing any change detected about the amount of reaction products present in the process chamber 2 is sent to a controller 163, which serves to on- and off-control output signal applied from a radio frequency oscillator (or power source) 162. When it is decided by the controller 163 that the amount of reaction products present in the chamber 2 is larger than a predetermined threshold value, that is, desired etching is progressing, the radio frequency oscillator 162 continues to be driven and radio frequency power of 13.56 MHz is thus applied to the upper electrode 21.

When it is decided by the controller 163 that the amount of reaction products present in the chamber 2 is smaller than the threshold value, that is, undesired etching is progressing, the radio frequency oscillator 162 is stopped. However, the chamber 2 is still being exhausted even at this time. Exhaust can be thus promoted on that face of the wafer which is to be processed, and the hole 113 formed can have a high aspect ratio, accordingly.

According to the above-described eighth embodiment, the replacement of deposition gases can be promoted while on- and off-controlling the radio frequency oscillator 162, responsive to any change in the amount of reaction products present in the chamber 2. Etching can be thus realized at a high aspect ratio while keeping its etching rate high. The time during which the radio frequency oscillator is stopped is preferably in a range of several hundreds nseconds— several seconds.

Radio frequency power is added to the upper electrode 21 and the lower electrode 5 is earthed in the above-described case. However, it may be arranged that the upper electrode 21 is earthed and that radio frequency power is applied to the lower electrode 5.

Figure 17:
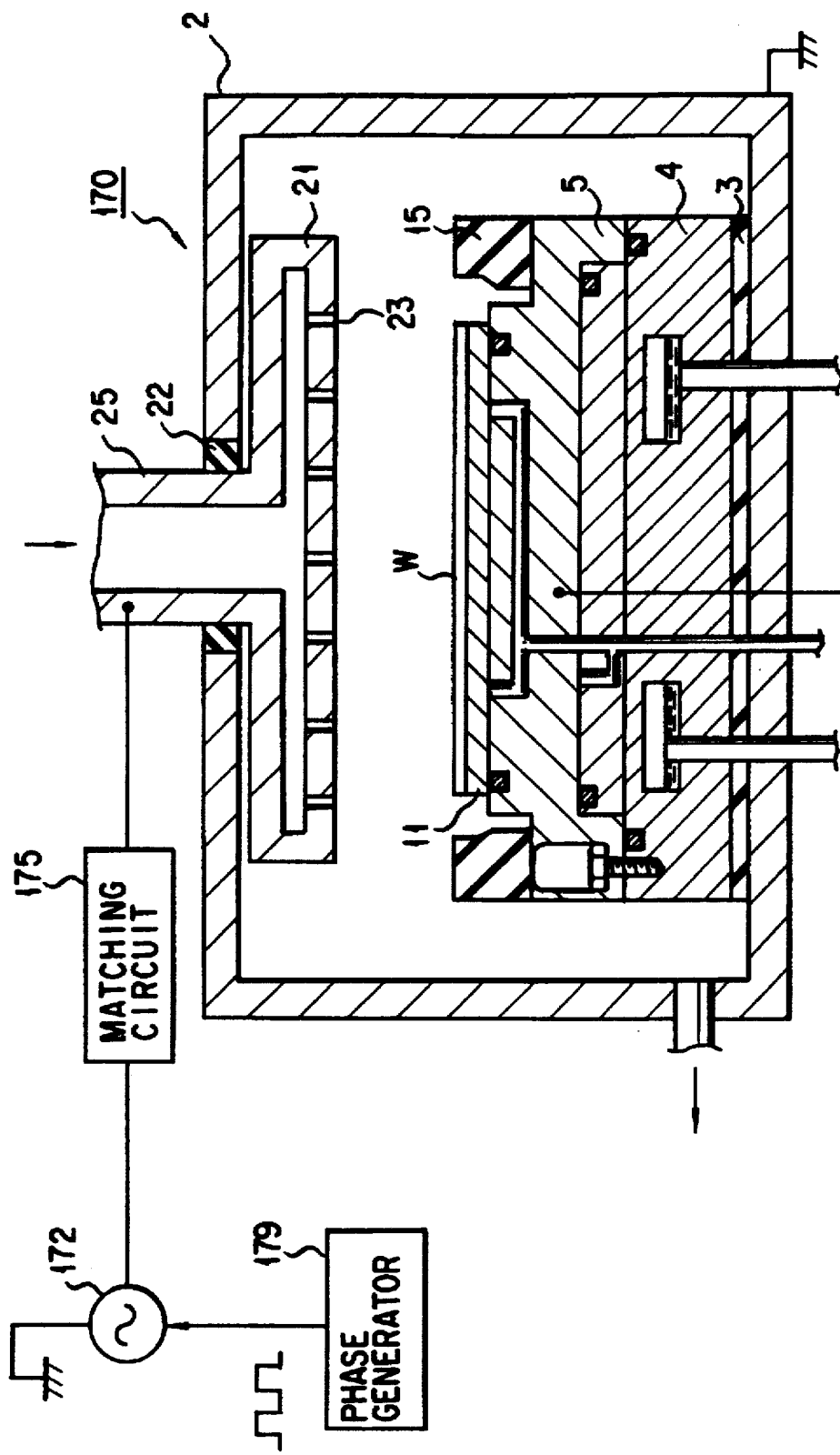
FIG. 17 is a block diagram showing the plasma treatment apparatus according to a ninth embodiment of the present invention.

Referring to FIG. 17, a ninth apparatus 170 will be described.

A pulse generator 179 is used instead of the mass spectrograph 169 in the apparatus 170. The output of a radio frequency oscillator 172 is on- and off-controlled at a predetermined time interval, responsive to pulse signal sent from the pulse generator 179. The time interval may be determined from experiments which will be conducted using dummy wafers. Or the replacement of deposition gases caught in the etching holes may be carried out while on- and off-controlling the output at an optional time interval of several hundreds nseconds—several seconds.

According to the ninth embodiment, the apparatus can be made simpler in arrangement, and etching can be realized at a higher aspect ratio, without making its etching rate low, only by on- and off-controlling the output of the radio frequency oscillator.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A plasma treatment apparatus for plasma-treating a substrate in a reduced-pressure atmosphere, comprising:

an electrically grounded chamber;

a first electrode located inside the chamber;

a second electrode located inside the chamber and facing the first electrode, said second electrode having a surface on which the substrate to be plasma-treated is placed;

gas supply means for supplying a plasma generating gas into the chamber from a region where the first electrode is located;

exhaust means for exhausting gas from the chamber, said exhaust means and said gas supply means controlling the chamber to have an internal pressure which is within 10 to 250 mTorr; and a plasma generating circuit for generating a high-frequency electric field between the first and second electrodes, said plasma generating circuit including:

a power supply for generating a high-frequency signal which has a first frequency $f_1$;

a frequency divider for deriving a high-frequency signal of a second frequency $f_1/n$ (n: an integer greater than 1) from the high-frequency signal of the first frequency $f_1$;

a first amplifier for amplifying the high-frequency signal of the first frequency $f_1$;

a second amplifier for amplifying the high-frequency signal of the second frequency $f_1/n$;

a first circuit for applying the amplified high-frequency signal of the first frequency $f_1$ to the first electrode; and a second circuit for applying the amplified high-frequency signal of the second frequency $f_1/n$ to the second electrode.

2. The plasma treatment apparatus of claim 1 wherein $f_1$ is about 13.56 Mhz.

3. A plasma treatment apparatus for plasma-treating a substrate in a reduced-pressure atmosphere, comprising:

an electrically grounded chamber;

a first electrode located inside the chamber;

a second electrode located inside the chamber and facing the first electrode, said second electrode having a surface on which the substrate to be plasma-treated is placed;

gas supply means for supplying a plasma generating gas into the chamber from a region where the first electrode is located;

exhaust means for exhausting gas from the chamber, said exhaust means and said gas supply means controlling the chamber to have an internal pressure which is within 10 to 250 mTorr; and a plasma generating circuit for generating a high-frequency electric field between the first and second electrodes, said plasma generating circuit including:

a high-frequency signal source for generating a high-frequency signal;

a phase controller for controlling a phase of the high frequency signal and producing first and second high-frequency output signals;

a first circuit including a first amplifier for amplifying the first high-frequency output signal produced by phase control, said first circuit applying the amplified first high-frequency output signal to the first electrode;

a second circuit including a second amplifier for amplifying the second high-frequency output signal produced by phase control, said second circuit applying the amplified second high-frequency output signal to the second electrode; and a detector for detecting products generated by chemical reaction in the chamber, and for supplying a detection signal to the phase controller, wherein said phase controller controls phases of the signals such that:

in an initial period of processing, the first and second high-frequency output signals applied to the first and second electrodes have a phase difference of anisotropic etching, and when a change in the products in the chamber has reached a threshold value, the first and second high-frequency output signals applied to the first and second electrodes have a phase difference of high isotropic etching tendency.

* * * * *